United States Patent [19]

Mueller-Hess et al.

[11] Patent Number: 5,242,779
[45] Date of Patent: Sep. 7, 1993

[54] PHOTOSENSITIVE MIXTURE CONTAINING PHOTOCURABLE COMPOUND AND POLYURETHANE BINDER WITH GRAFTED VINYL ALCOHOL UNITS, CARBOXYLIC ACID VINYL ESTER UNITS AND VINYL ACETAL UNITS

[75] Inventors: Waltraud Mueller-Hess, Wiesbaden; Dieter Mohr, Budenheim; Matthias Kroggel, Kelkheim, all of Fed. Rep. of Germany

[73] Assignee: Hoechst Aktiengesellschaft, Frankfurt am Main, Fed. Rep. of Germany

[21] Appl. No.: 825,424

[22] Filed: Jan. 23, 1992

Related U.S. Application Data

[63] Continuation of Ser. No. 541,794, Jun. 21, 1990, abandoned.

[30] Foreign Application Priority Data

Jun. 21, 1989 [DE] Fed. Rep. of Germany ....... 3920228

[51] Int. Cl.$^5$ .................. G03F 7/012; G03F 7/021
[52] U.S. Cl. ................... 430/175; 430/176; 430/197; 430/270; 430/271; 430/281; 430/906; 430/909
[58] Field of Search ............ 430/157, 175, 176, 197, 430/270, 284, 906, 909, 271, 281

[56] References Cited

U.S. PATENT DOCUMENTS

| | | | |
|---|---|---|---|
| 3,660,097 | 5/1972 | Mainthia | 430/175 |
| 3,867,147 | 2/1975 | Teuscher | 430/157 |
| 4,186,017 | 1/1980 | Palmer | 430/162 |
| 4,337,307 | 6/1982 | Neubauer | 430/157 |
| 4,387,151 | 6/1983 | Bosse et al. | 430/175 |
| 4,526,854 | 7/1985 | Watanabe et al. | 430/176 |
| 4,631,245 | 12/1986 | Pawlowski | 430/175 |
| 4,659,645 | 4/1987 | Frommeld et al. | 430/175 |

FOREIGN PATENT DOCUMENTS 246047 10/1987 Japan .................. 430/284
2185120 7/1987 United Kingdom .

Primary Examiner—Charles L. Bowers, Jr.
Assistant Examiner—Christopher G. Young
Attorney, Agent, or Firm—Foley & Lardner

[57] ABSTRACT

A photosensitive mixture is disclosed that contains a photocurable compound, for example, a diazonium salt polycondensation product, or a photocurable combination of compounds, for example, a photopolymerizable mixture, and a polymeric binder, which binder is a graft copolymer with a polyurethane graft backbone onto which chains containing vinyl alcohol units and vinyl acetal units derived from hydroxyaldehydes are grafted. The mixture is suitable for use in the production of printing plates and photoresists, can be developed with purely aqueous solutions, and gives printing plates distinguished by high resistance to mechanical and chemical attacks.

20 Claims, No Drawings

PHOTOSENSITIVE MIXTURE CONTAINING PHOTOCURABLE COMPOUND AND POLYURETHANE BINDER WITH GRAFTED VINYL ALCOHOL UNITS, CARBOXYLIC ACID VINYL ESTER UNITS AND VINYL ACETAL UNITS

This application is a continuation of application Ser. No. 07/541,794, filed Jun. 21, 1990, now abandoned.

BACKGROUND OF THE INVENTION

The present invention relates to a photosensitive mixture that can be developed with aqueous solutions, that contains a polymeric binder and a photocurable compound or combination of compounds, and that is suitable for the production of photosensitive recording materials, in particular of planographic printing plates and photoresists.

DE 20 24 244 (=U.S. Pat. No. 3,867,147) relates to photosensitive recording materials comprising co-condensation products of diazonium salts capable of condensation and other, non-photosensitive compounds, capable of condensation, if appropriate combined with polymeric binders, for producing printing plates. These photosensitive materials are distinguished by their high photosensitivity and long print runs. The number of prints obtained is particularly high, if water-insoluble binders, for example, polyvinyl formal, are used, but such layers can only be properly processed by means of developers containing a considerable amount of volatile organic solvents. For ecological reasons it is desirable to develop printing plates with purely aqueous solutions. In the most favorable cases, the printing plates can be developed with relatively aggressive acidic or alkaline purely aqueous solutions by suspending the non-image areas of the layer in the developer, in the form of flakes or relatively small particles. There is, however, the danger of uncontrolled redeposition of flaky matter in non-image areas of the plates whereby the plates are rendered unusable.

EP 152,819 relates to photosensitive mixtures comprising diazonium salt polycondensation products and binders containing carboxyl groups, that are obtained by reacting hydroxyl group-containing polymers with acid anhydrides. Plates produced using these mixtures can be developed with aqueous-alkaline solutions, and the mixtures are suited for the production of lithographic printing forms giving high print runs. It is, however, desirable to achieve even better print runs. For this purpose, the addition of minor amounts of other polymers is proposed, for example, polyurethanes, in order to increase the abrasion resistance. However, this combination results in a poor copying performance, such as undesired dot gain. Furthermore, the developing behavior and shelf life of the plates are impaired. Like other mixtures prepared with carboxyl-containing binders, these mixtures also suffer from the draw-back that upon being processed with developers based on tap water there is the risk of the formation of precipitates in the form of sparingly soluble calcium salts, which are deposited in the developing machines and cause disturbances.

Mixtures of this generic type, where polyurethanes are employed as polymeric binders, are described in U.S. Pat. No. 3,660,097 and DE 27 39 774. It is a disadvantage of these mixtures that the binders are sparingly soluble in the solvents conventionally used for coatings and that the solutions have to be filtered several times to remove insoluble residues. The developability of these mixtures in aqueous-alkaline media is very limited and the print runs are inadequate for high-performance machines.

A similar mixture is described in EP 30,001. The binder contained therein is a branched polyurethane. Using this mixture, relatively high print runs can be achieved, but there are still a number of drawbacks. For example, acidic aqueous developer solutions with an addition of organic solvents are preferably employed for achieving a scum-free, rapid development of the photocured layer. When used for automatic processing, these developers may cause corrosion problems at the light metal parts of the processing equipment.

EP 167 963 describes a negative-working photosensitive mixture which is suitable for the production of planographic printing plates and comprises a diazonium salt polycondensation product, an ethylenically-unsaturated compound which can be polymerized by a free-radical process, a photoinitiator and a water-insoluble polymeric binder. High print runs can be achieved when polyvinyl acetals are used as binders. In this case development can, however, only be performed with solutions that comprise predominantly organic solvents.

EP 274,075 discloses photocurable mixtures which comprise a photocurable substance and a polyvinyl acetal obtained by reacting vinyl alcohol polymers with hydroxy-containing aldehydes. These mixtures, which are suitable for the production of planographic printing plates and photoresists, can be developed with neutral or weakly alkaline aqueous solutions. They give printing plates of relatively high print runs, but the number of prints which can be obtained is inferior to the print run of plates which cannot be developed with purely aqueous solutions.

In DE 37 32 089 graft polymers are described, which comprise a polyurethane as the graft backbone and grafted-on vinyl ester units, which are at least partially saponified to give vinyl alcohol units. The polymers are suitable as binders for pigments; for preparing printing inks, thermoplastic adhesives and solvent-containing adhesives; as constituents of varnishes or coatings for fibers, films and metals, and for thermoplastic shaped articles.

JP 246,047/87 describes photopolymerizable mixtures in which graft polymers of polyurethanes and polyvinyl alcohol with mercapto groups are contained as binders.

Graft polymers obtained from the graft polymers described in DE 37 32 089 above, by acetalizing with aldehydes, are described in German Patent Application P 38 35 840.9.

German Patent Application P 38 24 146.3 discloses photocurable elastomeric mixtures containing a compound polymerizable by a free-radical process, a photoinitiator and, as the binder, a graft polymer according to DE 37 32 089, which is soluble or dispersible in an aqueous solution.

SUMMARY OF THE INVENTION

It is therefore an object of the present invention to provide a photosensitive mixture which is suitable for use in the production of printing plates, particularly lithographic printing plates, or of photoresists; which has all the advantages of known photosensitive mixtures; which can be developed by means of virtually solvent-free, aqueous solutions, without resulting in disturbing deposits when developer solutions containing tap water are employed; and which, at the same time, yields printing plates of high photospeed and image resolution, which give high print runs and have a good ink acceptance and long shelf life. Up to now, these properties could only be achieved with printing plates requiring the addition of relatively large amounts of organic solvents in the developing process.

These and other objects according to the invention are provided by a photosensitive mixture comprising a photocurable compound or combination of compounds and a polymeric binder with repeating vinyl acetal units, wherein the binder is a graft copolymer comprising a polyurethane graft backbone, onto which chains containing vinyl alcohol units and vinyl acetal units derived from hydroxyaldehydes are grafted. A photosensitive recording material comprising a photosensitive layer of this mixture on a support is also provided.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

In accordance with the present invention, a photosensitive mixture is provided which contains, as essential constituents, a photocurable compound or combination of compounds and a polymeric binder possessing repeating vinyl acetal units. The polymeric binder is a graft polymer in which the graft backbone is a polyurethane onto which chains containing vinyl alcohol units and vinyl acetal units derived from hydroxyaldehydes are grafted. The present invention provides a photosensitive recording material comprising a layer support and a photosensitive layer comprising this mixture.

The graft polymers contained in the mixture of the instant invention are novel. To prepare them, a carboxylic acid vinyl ester and, optionally, another ethylenically-unsaturated compound copolymerizable therewith, is grafted onto a polyurethane graft backbone and thereafter saponified completely or partially. Polymers having vinyl alcohol units obtained in this way are described in DE 37 32 089, and are further reacted with hydroxyaldehydes to give the novel polyvinyl acetals.

The proportion of the grafted-on components is generally about 10 to 95, preferably about 30 to 90, and in particular about 40 to 80, % by weight, based on the total graft polymer.

The graft backbones consist of polyurethanes having at least two urethane groups in the molecule, the number of urethane groups per molecule being subject to no particular upper limit and generally having values higher than 2.

The polyurethanes employed as graft backbone can be produced from diols and diisocyanates by conventional processes of polyurethane synthesis. In principle, all of the diols customarily used in polyurethane synthesis can be employed. Cycloaliphatic diols, such as cyclohexanediols, and in particular aliphatic diols having 2 to 12 carbon atoms are preferred. Polyetherdiols, for example, polypropylene oxides, polybutylene oxides and copolymers of ethylene oxide, propylene oxide and butylene oxide, preferably the block copolymers thereof, or poly-1,4-butanediols are also preferred; polyethylene oxides with molecular weights between about 200 and 10,000, and more preferably between about 400 and 1,500 are particularly preferred. The polyetherdiols are advantageously employed in combination with low-molecular aliphatic diols, for example 1,4-butanediol, 1,3-propanediol, ethylene glycol, diethylene glycol, 1,2-hexanediol, 1,2-propanediol, pentanediol or cyclohexanediol. The molar ratio of polyetherdiol to low-molecular aliphatic diol is preferably from about 1:0.1 to 1:0.7.

Aromatic diisocyanate components can be employed, but aliphatic and/or cycloaliphatic diisocyanates are preferred. Preferred aliphatic diisocyanates are those having 2 to 12 carbon atoms in the aliphatic radical, for example, ethylene diisocyanate, propylene diisocyanate, tetramethylene diisocyanate and 2,2,4-trimethylhexamethylene diisocyanate. Preferred cycloaliphatic diisocyanates are, for example, 1,4-diisocyanatocyclohexane, dicyclohexylmethane-4,4'-diisocyanate and isophorone diisocyanate. Hexamethylene diisocyanate and isophorone diisocyanate are particularly preferred.

The molar ratio of diol component to diisocyanate component is preferably between about 1:0.99 and 1:0.5, in particular between about 1:0.98 and 1:0.7. The average molecular weights of the polyurethanes are preferably between about 200 and 100,000, in particular between about 1,000 and 50,000, and more particularly between about 3,000 and 25,000.

Carboxylic acid vinyl esters having 3 to 20 and preferably 4 to 14 carbon atoms are employed for grafting onto the polyurethane. Vinyl acetate and/or vinyl propionate, in particular vinyl acetate, are preferred.

Mixtures of vinyl acetate and/or vinyl propionate and vinyl versatate are also preferred. Particularly when there is partial or complete saponification of the products following the graft polymerization, the co-use of vinyl propionate in addition to vinyl acetate during grafting is advantageous. Moreover, copolymerizable mixtures of carboxylic acid vinyl esters can be grafted, preferably mixtures of vinyl acetate and minor amounts of vinyl versatate.

Grafting with different carboxylic acid vinyl esters in the form of block copolymers, optionally in combination with further ethylenically-unsaturated and copolymerizable monomers, can also be advantageous. Furthermore, the carboxylic acid vinyl esters can also be grafted together with other ethylenically-unsaturated and copolymerizable monomers, in particular acids, such as maleic acid, itaconic acid, mesaconic acid, crotonic acid, acrylic acid or the esters thereof.

The graft polymers obtained can be converted by hydrolysis, alcoholysis or transesterification into partially or completely saponified products, the degree of hydrolysis being at least about 30 mol %, preferably about 45 to 99 mol %, based on the mole number of saponifiable monomer units in the graft polymer. The production of graft polymers with a polyurethane graft backbone is described in DE 37 32 089.

The saponified graft polymers can be acetalized in an acidic medium by means of methods known per se. For the acetalization reaction, aliphatic $C_2$ to $C_{20}$ hydroxyaldehydes, which may be substituted, are employed. Preference is given to aldehydes corresponding to one of formulae I and II

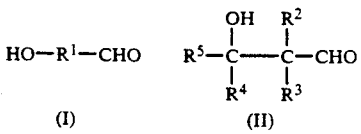

in which
- $R^1$ is a substituted or unsubstituted alkylene group containing 1 to 6 carbon atoms,
- $R^2$ and $R^3$ are identical to or different from one another and denote hydrogen atoms, alkyl radicals containing 1 to 6 carbon atoms, alkoxy radicals containing 1 to 4 carbon atoms, hydroxyalkyl radicals containing 1 to 3 carbon atoms or hydroxyl groups,
- $R^4$ is a hydrogen atom or an alkyl radical containing 1 to 6 carbon atoms, and
- $R^5$ is a hydrogen atom, an alkyl, hydroxyalkyl or alkoxyalkyl radical containing 1 to 6 carbon atoms or a substituted or unsubstituted aryl radical containing 6 to 10 carbon atoms.

Suitable hydroxyaldehydes are described in EP 274,075.

In the compounds of formulae I and II, the symbols preferably have the following meanings:
- $R^1$ may contain, in particular, halogen atoms or alkoxy groups as substituents and has in total 1 to 6, preferably 2 to 5 carbon atoms,
- $R^2$ and $R^3$ are preferably hydrogen atoms, alkyl radicals containing 1 to 4 carbon atoms or hydroxymethyl radicals,
- $R^4$ is preferably a hydrogen atom, and
- $R^5$ is preferably a hydrogen atom or an alkyl radical containing 1 to 4 carbon atoms, a hydroxyalkyl radical or an alkoxyalkyl radical containing 1 to 4 carbon atoms.

The hydroxyaldehydes corresponding to formulae I and II contain at least one and up to three, preferably up to 2 hydroxyl groups. Among the hydroxyaldehydes, preference is given to the autocondensation products of acetaldehyde and its higher homologues and to the condensation products of acetaldehyde with propionaldehyde or higher aliphatic aldehydes, and also to 4-hydroxybutanal and 5-hydroxypentanal.

Apart from the hydroxyaldehydes, aliphatic aldehydes having 1 to 20 carbon atoms, which may be substituted, and aromatic aldehydes, which may also be substituted, are preferably employed. Preference is given to aliphatic aldehydes having 1 to 5 carbon atoms, such as n-butyraldehyde, isobutyraldehyde, propionaldehyde or acetaldehyde. Substituted or unsubstituted benzaldehydes, such as benzaldehyde, p-chlorobenzaldehyde or p-methoxybenzaldehyde are also suitable.

It is also possible to use the corresponding acetals with lower alcohols, for example, 2-methoxy-acetaldehyde dimethyl acetal, bromo- or chloroacetaldehyde diethyl acetal or the reaction products of phenols with halogenoalkyl-dialkyl acetals, instead of the free aldehydes. The acetals can be reacted with the polymer directly or after having been hydrolysed to give the aldehyde.

The graft copolyvinyl acetals used in the mixture according to this invention thus contain at least two, and preferably four, different types of units in the grafted-on side chains. These units are:
a) vinyl alcohol units,
b) optional carboxylic acid vinyl ester units,
c) vinyl acetal units with free OH groups, and
d) optional vinyl acetal units without free OH groups.

The amounts of the individual units are for:
a) about 15 to 70, preferably about 20 to 50, mol %,
b) about 0 to 65, preferably about 1 to 50, mol %,
c) about 5 to 70, preferably about 7 to 65, mol %,
d) about 0 to 75, preferably about 10 to 70, mol %.

The hydroxyl number of the ready-for-use binder should be in the range of about 100 to 800, preferably about 150 to 600.

The acetalization can be performed employing two different methods. In accordance with a first process, the graft polymer is dissolved or dispersed in an alcohol or in a water/alcohol mixture, mixed with a catalytic amount of an organic or inorganic acid and the aldehyde or aldehyde mixture, and heated. The resulting polymer solution, which where appropriate also contains an anti-oxidant, can either be used directly for preparing the mixtures according to this invention, or alternatively, the polymer can be precipitated and purified by dropwise adding the solution to a non-solvent.

In accordance with a second process, the graft polymer is dissolved in water or a water/alcohol mixture and mixed with the aldehyde or aldehyde mixture. Subsequently, an aqueous solution of an inorganic or strong organic acid—if appropriate with the addition of a surfactant and of an antioxidant—is added dropwise at a low temperature, preferably between −10° C. and room temperature. The acetalized graft polymer is precipitated. The reaction is completed at an increased temperature of about 20° to 60° C. The isolated polymer is purified by washing with water or re-precipitation. This second process variant gives more uniform products.

To prepare the graft polyvinyl acetals in an aqueous medium, known methods are employed to produce about 1 to 50% strength, preferably about 5 to 20% strength, aqueous solutions of the graft polyvinyl alcohols, preferably at elevated temperatures. The acid catalyst is added, the solutions are then cooled to temperatures of less than about 25° C., and the acetalization reaction is finally performed by metering in the aldehyde with agitation, preferably within a time of about 3 to 300 minutes. As is known, the aldehyde conversion is incomplete in most cases, and therefore an excess of aldehyde, preferably of about 10 to 20 mole percent, is usually added.

In a preferred process variant, the aqueous solution is allowed to stand for at least about 30 minutes at temperatures of about 0° to 5° C. prior to the start of the reaction, whereupon the graft polyvinyl acetal formed is generally separated off after a short time, as a pulverulent substance. To complete the reaction, the reaction mixture is slowly heated to room temperature, and where appropriate it is post-reacted at elevated temperatures, for example, at about 25° to 70° C., during about one to three hours. The added amount of acid catalyst depends, inter alia, on the degree of acetalization to be achieved and may preferably be up to about 1.1 mole, relative to the molar content of vinyl alcohol units.

The resulting graft polyvinyl acetal is isolated by suction, washed with weakly alkaline water (pH 9 to 12) and dried. Acetalization products which do not precipitate from the aqueous reaction solution can be isolated by the addition of precipitating agents, purified and dried.

The acetalization can also be performed in organic solvents. Suitable solvents include water-miscible solvents, in particular water-soluble alcohols, such as ethanol and/or methanol, to which water may be added.

Preferred acid catalysts are organic sulfonic acids, for example, toluene sulfonic acids, and also mineral acids, for example sulfuric acid, phosphoric acid, hydrochloric acid or nitric acid. Among these, preference is given to phosphoric acid and hydrochloric acid.

For preparation in organic solvents, the acid catalyst, the aldehyde and the graft polyvinyl alcohol are dispersed or dissolved in the solvent, and the mixture is refluxed. It may also be expedient to add the aldehyde in the course of the reaction. The graft polyvinyl alcohols which are insoluble in the organic solvents gradually dissolve as a consequence of the acetalization in progress.

When the acetalization reaction is completed, the reaction product is precipitated by adding non-polar solvents, for example, aliphatic hydrocarbons, or by pouring the reaction solution into ice-cold water or an ice-cold water/alcohol mixture. The product is isolated by suction, washed with weakly alkaline water (pH 9 to 12), and dried.

In combination with various negative-working photosensitive substances, such as diazonium salt polycondensation products, azido compounds, p-quinonediazides or photopolymerizable mixtures comprising polymerizable compounds and photoinitiators, the polymers obtained in this way result in layers which can be developed easily and without scumming. Depending on their individual composition, the layers can be developed with aqueous solutions of inorganic salts and/or surfactants, or with aqueous-alkaline solutions. The layers are distinguished by a high abrasion resistance, good ink acceptance and adequate shelf lives, and can therefore be used for numerous applications, in particular for producing planographic printing plates, screen printing stencils and photoresists.

The photosensitive mixtures generally contain about 20 to 90, and preferably about 30 to 75, % by weight of polymeric binder, relative to the weight of all non-volatile constituents of the mixture. Up to about 50% by weight, preferably up to about 20% by weight, of the total amount of binder can be replaced by customary binders.

Suitable photocurable compounds include, in particular, diazonium salt polycondensation products, for example, of diphenylamine-4-diazonium salts, with aldehydes, preferably with formaldehyde. It is particularly advantageous to use co-condensation products containing, in addition to the diazonium salt units A-N$_2$X, other, non-photosensitive units B which are derived from condensible compounds, particularly from aromatic amines, phenols, phenol ethers, aromatic thioethers, aromatic hydrocarbons, aromatic heterocyclic compounds and organic acid amines. These condensation products are described in DE 20 24 244. Generally, all diazonium salt polycondensation products described in DE 27 39 774 are suitable.

The diazonium salt units A-N$_2$X are preferably derived from compounds corresponding to the formula $(R^1-R^2-)_pR^3-N_2X$, in which X is the anion of the diazonium compound,
p is an integer from 1 to 3,
$R^1$ is an aromatic radical which is capable, in at least one position, of condensation with an active carbonyl compound,
$R^3$ is an arylene group, preferably a phenylene group which may be substituted,
$R^2$ is a single bond or one of the groups:
—(CH$_2$)$_q$—NR$^4$—,
—O—(CH$_2$)$_r$—NR$^4$—,
—S—(CH$_2$)$_r$—NR$^4$—,
—S—CH$_2$CO—NR$^4$—,
—O—R$^5$—O—,
—O—,
—S—, or
—CO—NR$^4$—, where
q is a number from 0 to 5,
r is a number from 2 to 5,
$R^4$ is a hydrogen atom, an alkyl group having from 1 to 5 carbon atoms, an aralkyl group having from 7 to 12 carbon atoms or an aryl group having from 6 to 12 carbon atoms, and
$R^5$ is an arylene group having from 6 to 12 carbon atoms.

Further advantageous polycondensation products are obtained by condensing an optionally-substituted diphenylamine diazonium salt, first with aromatic compound R'—O—CH$_2$—B and then with an aromatic compound R'—O—CH$_2$—B—CH$_2$—O—R', R' denoting a hydrogen atom, an alkyl radical or an aliphatic acyl radical, and B denoting the radical of any one of the condensible compounds listed above. These condensation products are described in detail in EP 126,875. The added amount of diazonium salt polycondensation products generally varies between about 5 and 70% by weight, preferably between about 10 and 50% by weight, relative to the non-volatile constituents of the mixture.

Low- or high-molecular weight azido derivatives are also suitable for use as photocurable compounds for certain applications, preference being given to low-molecular weight azido compounds having at least two azido groups per molecule. Examples of suitable compounds include 4,4'-diazidostilbenes, 4,4'-diazidobenzophenones, 4,4'-diazidobenzalacetophenones, 4,4'-diazidobenzalacetones and 4,4'-diazidobenzalcyclohexanones. Where appropriate, the photospeed of azido compounds of this type can be increased by adding suitable sensitizers, for example, 1,2-benzanthraquinone. It is also possible to use polyfunctional azides whose absorption is shifted as a result of conjugation with double bonds in the molecule so that no additional sensitization is required upon exposure. Further suitable azido compounds are described in GB 790,131, DE 950,618 and U.S. Pat. No. 2,848,328. The mixtures according to the present invention generally comprise from about 5 to 60, preferably from about 10 to 40, percent by weight of azido compounds, relative to the non-volatile constituents of the mixture.

To stabilize the photosensitive mixtures containing diazonium salt polycondensation products, it is advantageous to add a compound having an acidic character. These acidic compounds include mineral acids and strong organic acids, with phosphoric acid being preferred. The mixtures may also contain dyes and/or pigments, which serve both as contrast-enhancers and to stabilize the layer.

As the photocurable substances, the mixtures and materials according to the invention may also contain combinations of free-radically polymerizable compounds with photoinitiators. Preferably, esters of acrylic or methacrylic acid with mono- or polyhydric, preferably primary, alcohols are used as the polymerizable compounds. Preferably, the polymerizable compounds should possess more than one, in particular 2 to 4, polymerizable groups. Examples of suitable polyhydric alcohols are ethylene glycol, propylene glycol, butane-1,4-diol, butane-1,3-diol, diethylene glycol, triethylene glycol or polyethylene glycols or polypropylene glycols with molecular weights from about 200 to 1,000, neopentyl glycol, glycerol, trimethylolethane, trimethylolpropane, pentaerythritol, bisphenol-A derivatives and reaction products of these compounds with ethylene oxide and/or propylene oxide. Bis-acrylates and bis-methacrylates which contain urethane groups and which are obtained by the reaction of 1 mole of a diisocyanate with 2 moles of a hydroxyalkyl acrylate or hydroxyalkyl methacrylate are particularly suited. The diisocyanate may also be an oligomeric product obtained by the reaction of a diol with a molar excess of a monomeric diisocyanate. These and similar monomers containing urethane groups are described in DE 20 64 079, DE 28 22 190, DE 30 48 502 and DE 35 40 480.

In addition to the esters mentioned above, amides of acrylic or methacrylic acid can be employed. Examples are methylene-bis-(meth)acrylamide, ethylene-bis-(meth)acrylamide and m-xylylene-bis-(meth)acrylamide.

The amount of monomers contained in the mixture generally is about 10 to 80% by weight, preferably about 25 to 70% by weight, of the non-volatile constituents.

A large number of substances can be used as photoinitiators. Examples include benzoins; benzoin ethers; polynuclear quinones, such as 2-ethylanthraquinone; acridine derivatives, such as 9-phenylacridine or benzacridine; phenazine derivatives, such as 9,10-dimethylbenz-(a)phenazine; quinoxaline derivatives or quinoline derivatives, such as 2,3-bis-(4-methoxyphenyl)quinoxaline or 2-styrylquinoline; quinazoline compounds; or acylphosphine oxide compounds. Photoinitiators of this type are described in DE 20 27 467, DE 20 39 861, DE 37 28 168, EP 0,011,786 and EP 0,220,589. Hydrazones, mercapto compounds, pyrylium salts or thiopyrylium salts, xanthones, thioxanthones, benzoquinones, acetophenones, benzophenones, synergistic mixtures with ketones or hydroxyketones and dyestuff redox systems may also be used. Particular preference is given to photoinitiators possessing photo-cleavable trihalomethyl groups, especially to corresponding compounds of the triazine or thiazoline series. Compounds of this type are described in DE 27 18 259, DE 33 33 450 and DE 33 37 024. 2-(4-Methoxystyryl)-4,6-bis-trichloromethyl-s-triazine is a preferred example. It is advantageous to combine these compounds with photooxidizable dyes, photoreducible compounds and optionally further coinitiators, as is described, for example, in EP 0,284,939 and EP 0,287,817.

The photoinitiators are generally employed in a quantity from about 0.1 to 15, and preferably from about 0.5 to 10, % by weight, relative to the non-volatile constituents of the mixture.

Depending on their intended use and on their desired properties, the photopolymerizable mixtures may contain a number of various additives, such as, for example, inhibitors to prevent thermal polymerization of the monomers, hydrogen donors, dyes, colored and uncolored pigments, color formers, indicators, plasticizers and chain transfer agents.

The photopolymerizable mixtures can also be combined with other, negative-working photosensitive compounds, in particular with diazonium salt polycondensation products.

Processing of the mixtures according to this invention into photosensitive recording materials is performed in a known manner by coating a suitable support with a solution of the mixture and drying the applied coating, so that a layer having the desired thickness is obtained. Suitable supports include metals and also polyester film or cellulose acetate film, Perlon gauze, etc. The support material may function as the final support or as a temporary support material from which the photosensitive layer is transferred by lamination to the workpiece to be processed.

The recording material which is prepared using the photosensitive mixtures of the invention serves, on the one hand, to produce images on suitable supports or receptor sheets and, on the other hand, to produce reliefs which are used as printing plates, screens, resists, and the like. In addition, it is also possible to use the photosensitive mixtures for the formulation of UV-hardenable printing inks or for the preparation of lacquers which are hardenable by ultraviolet radiation that may be used for the protection of surfaces.

Primarily, the compositions are used for the production of lithographic printing plates, in which aluminum is the preferred support material. It is particularly preferred to pretreat the aluminum used for this purpose in the usual manner, for example, by a mechanical, chemical or electrochemical graining process which is, optionally, followed by an anodic oxidation. A further treatment of this support material, for example, with polyvinyl phosphohic acid, alkali metal silicate, phosphate, hexafluorozirconate, chromate, borate, polyacrylamide and cellulose derivatives is advantageous.

The recording materials obtained from the mixtures are processed in the conventional manner, by exposing imagewise and washing-out the unexposed areas of the layer with a suitable developer.

The recording material is exposed under an original, as is known in the art, using light sources which emit light with the highest possible spectral fraction in the near ultraviolet region. The material can also be exposed by laser irradiation. Suitable lasers for irradiation are shorter-wave lasers of adequate performance, for example, Ar lasers, krypton ion lasers, helium/cadmium lasers, emitting in the region between about 300 and 600 nm and, for some layers, even $CO_2$ lasers, which emit at about 10.6 $\mu$m, or YAG lasers emitting at about 1.06 $\mu$m.

As the developer solutions, water or neutral or alkaline aqueous solutions are used, which have a pH value in the range from 6 to 14, preferably from 7.5 to 12. The solutions contain buffer salts, for example, water-soluble alkali metal phosphates, alkali metal silicates, alkali metal borates, alkali metal carbonates, alkali metal acetates or alkali metal benzoates. Additional constituents include wetting agents, preferably anionic wetting agents and, if appropriate, water-soluble polymers. The solution can also contain minor amounts, for example, up to 5 percent by weight and preferably not more than 2 percent by weight, of water-miscible organic solvents. It is preferred to use solvents that do not tend to volatilize, for example, araliphatic alcohols, the vapor pressure of which is of no consequence in the handling of the developer. Development can be performed in the conventional manner by dipping, spraying, brushing or wiping-over with a pad. If desired, the developed material can be treated with a gumming solution.

The photosensitive recording materials of this invention are distinguished by good reproduction properties and an adequate shelf life. They can be easily developed without scum, using developer solutions which from an ecological point of view are virtually neutral. The long print runs and the good ink acceptance obtained with printing forms prepared using the material of the present invention are particularly advantageous. The printing stencils are also highly resistant to alkaline developers and other processing solutions.

If the mixture according to the invention contains a photopolymerizable combination of compounds, it is not absolutely necessary to exclude atmospheric oxygen during exposure. Nevertheless, it is generally favorable to keep the mixture away from the influence of atmospheric oxygen during the photopolymerization. When the mixture is used in the form of thin copying layers, it is advisable to apply a suitable protective film which is substantially impermeable to oxygen. This film can be self-supporting and can then be peeled off before development of the copying layer. For this purpose, polyester films, for example, are suitable. The protective film can also comprise a material which dissolves in the developer liquid or can be removed during development, at least from the non-hardened areas. Materials suitable for this purpose are, for example, polyvinyl alcohol, vinyl alcohol/vinyl acetate copolymers, polyvinylpyrrolidone, vinylpyrrolidone/vinyl acetate copolymers, polyacrylic acid, butadiene/maleic acid copolymers, polyvinylmethyl ethers, polyphosphates, sugars, etc. Such protective layers generally have a thickness of about 0.1 to 10 µm, preferably of about 0.5 to 5 µm.

When photopolymerizable mixtures are employed, the print runs can be increased by post-heating the exposed plates or by post-exposing the developed plates. The two process steps can also be combined. But even without an additional heat treatment or post-exposure high print runs are achieved.

A thermal post-treatment is also a suitable means for additionally strengthening photosensitive layers containing other photosensitive compounds, such as diazonium salt polycondensation products. Such a treatment is particularly recommended for planographic printing forms. It comprises heating the gummed printing form to a temperature of between about 180° C. and 240° C. The duration of the treatment depends on the temperature and generally is about two to twenty minutes. With this thermal post-treatment no surfactant is required. It is assumed that under these conditions the graft polyvinyl acetals split off water and are converted into polymers having unsaturated side groups which are able to undergo an additional photochemical or thermal cross-linking reaction. It may therefore be expedient to add a thermal crosslinking agent to the photosensitive mixture, such as, for example, an organic peroxide, which has a scorch temperature of at least 100° C. and above this temperature is capable of forming free radicals of the type described in EP 247,461. Examples of suitable peroxides include peroxy-esters, peroxyketals, bisaralkyl peroxides, dialkyl peroxides and bis-dialkyl peroxides. The ink acceptance of the photosensitive layers is substantially improved by this thermal post-treatment, in particular, if the polymers employed have high hydroxyl numbers.

Furthermore, the mixtures according to the present invention are suitable for the production of resist stencils exhibiting excellent image resolution and possessing satisfactory thermal stability and shelf lives. In this case, too, very mild developer solutions can be used, which are relatively or completely untoxic. The manufacture of screen printing stencils is yet another field of application. The mixtures are distinguished by favorable processing characteristics and long shelf lives.

The preparation of the polyvinyl acetals used in the Examples is described below.

a) Prepartaion Of Polyurethane Graft Backbones

In each case, the diol component and the catalyst were first introduced into a reaction vessel equipped with a stirrer and supplied with a nitrogen atmosphere, and the mixture was heated to a reaction temperature of between about 65° C. and 100° C. Then the diisocyanate component was metered in, with care being taken to ensure that the temperature of the reaction mixture did not exceed about 120° C., and preferably did not exceed about 100° C. After the complete addition of the diisocyanate component, the mixture was post-heated to a temperature between 80° C. and 100° C. for a period of up to two hours in order to complete the reaction. The completion of the conversion, and thus the end of the reaction, were determined by an analysis of the diisocyanate consumption with the aid of known methods (p.e., IR-spectroscopy, titration).

The detailed composition of the reaction mixtures used in the Examples and the calculated mean molecular weights ($\overline{M}_{calc}$) of the resulting polyurethanes (PU) are compiled in Table below. The molecular weights result from the molar ratio diol component/diisocyanate, assuming a complete conversion of the NCO groups.

TABLE 1

| Poly-urethane (PU) | Diol component PEG/PU (molar ratio) | Reaction temperature (°C.) | Molar ratio diol component/ diisocyanate | $\overline{M}_{calc}$ |
|---|---|---|---|---|
| A | 7:3 | 80 | 1:0.9 | 6,470 |
| B | 7:3 | 72 | 1:0.9 | 6,470 |
| C | 3:2 | 78 | 1:0.97 | 18,300 |
| D | 7:3 | 75 | 1:0.97 | 19,900 |

PEG = Polyethylene glycol, molecular weight 600
Bu = 1,4-butanediol

All products were prepared using isophorone diisocyanate as the diisocyanate component. In each case, 1,4-dimethylpiperazine was used as the catalyst in an amount of 0.48 mol %, relative to the diisocyanate.

b) Preoaration Of The Graft Polymers

In each case, the polyurethane graft backbone was melted in a reaction vessel in a nitrogen atmosphere or was dissolved, respectively, by adding small amounts of methanol, and heated to a temperature between about 60° C. and 100° C. The monomers to be grafted on, which had optionally been dissolved in a solvent, e.g. methanol, including the free-radical initiator dissolved in the monomer, were then slowly metered to the polyurethane graft backbone, such that homopolymer formation was largely suppressed.

The maximum temperature of the reaction mixture should be about 120° C., more preferably about 100° C.

When the post-reaction was completed, excess monomer remainders were removed by azeotropic distillation with methanol. The compositions of the individual reaction mixtures and the reaction parameters are compiled in Table 2 below.

TABLE 2

| Graft polymer | PU | VAc g/g PU | Start temp. °C. | Metering time min | Post-react. min | Grafted-on monom. wt % | $J_o$ ml/g | calc. molecular weight |
|---|---|---|---|---|---|---|---|---|
| AV | A | 4 | 75 | 420 | 45 | 79.8 | 21.9 | 31,300 |
| BV | B | 2.32 | 73 | 420 | 45 | 69.3 | 18.3 | 21,000 |
| CV | C | 3.16 | 75 | 300 | 45 | 74.7 | 26.3 | 72,500 |
| DV | D | 3.16 | 75 | 420 | 45 | 74.5 | 28.7 | 78,000 |

VAc = Vinyl acetate
$J_o$ = intrinsic viscosity

All products were prepared employing 0.2 mol % of dibenzoyl peroxide (relative to the monomer used in each case). The intrinsic viscosities were determined at 25° C. in tetrahydrofuran, using an Ostwald Viscosimeter, with the measured concentrations being selected such that a Hagenbach correction was not necessary. The grafted-on amount of monomer, in % by weight, is related to the weight of the total polymer.

c) Saponification Of The Graft Polymers

The graft polymers of Table 2 were transesterified or saponified within two hours at room temperature. For this purpose, the products were dissolved in methanol to give 50% strength solutions and mixed with methanolic soda lye (10% strength). Depending on the added amount of alkali and the degree of grafting of the graft polymer, polymeric hydrolysis products having different degrees of hydrolysis were obtained. The resulting gels were granulated, and the granules were washed with methanol (where appropriate with an addition of acetic acid to neutralize the soda lye) and dried. The process parameters and results are compiled in Table 3 below.

TABLE 3

| Graft polyvinyl alcohol | Graft polyvinyl acetate | mole % of NaOH per ester unit | mole % of H₂O per ester unit | Degree of hydrolysis in % | $\bar{M}_{calc}$ |
|---|---|---|---|---|---|
| E | AV | 1.92 | 0 | 98.2 | 22,000 |
| F | BV | 5.00 | 0 | 98.9 | 14,000 |
| G | CV | 1.92 | 0 | 98.0 | 47,000 |
| H | DV | 1.97 | 0 | 98.4 | 44,000 |
| I | CV | 0.50 | 11.13 | 56.5 | 58,000 | d) Prepatiton Of Thr Graft Polyvinyl Acetals

The graft polymers listed in Table 3 were dissolved in about eight times their amount of distilled water. The corresponding amount of aldehyde and a small amount of 2,6-di-tert.-butyl-4-methylphenol were added at room temperature. A solution comprising a small amount of sodium octyl sulfate, ⅛ of the weight amount of the aldehyde of concentrated hydrochloric acid and water was dropwise added to this solution, with agitating. The mixture was stirred for one hour at room temperature, then heated to 40° C., and stirring was continued for another two hours. Thereafter concentrated hydrochloric acid (the same weight amount as the aldehyde) was added and stirring was continued at 40° C. for a further two hours. When the mixture had cooled down to room temperature the aqueous phase was decanted from the precipitated polymer, the polymer was dissolved in ethanol and precipitated by pouring it into an excess amount of water. The polymer was dried in a vacuum drier at 40° C. until its weight remained constant.

TABLE 4

| Graft polyvinyl acetal | Graft polyvinyl alcohol | Aldehyde | Molar ratio | OH number |
|---|---|---|---|---|
| K | E | Prl + 4-ClBz | 1:2 | 302 |
| L | F | Bul + 4-CH₃OBz | 1:1 | 416 |
| M | G | Bul + Bu | 1:1 | 441 |
| N | H | Acl + Bu | 1:1 | 394 |
| O | I | Tri + Bu | 3:1 | 551 |
| P | H | Prl + Bz | 1:2 | 332 |
| Q | F | Tri + Bu | 1:2 | 270 |
| R | G | Tri + Bu | 1:3.7 | 187 |
| S | H | Bul + Ac | 1:1 | 419 |
| T | E | Tri + Pr | 1:2 | 244 |

Ac = acetaldehyde
Acl = acetaldol
Pr = propionaldehyde
Prl = propionaldol
Bu = butyraldehyde
Bul = butyraldol
Bz = benzaldehyde
4-CH₃OBz = 4-methoxy-benzaldehyde
4-ClBz = 4-chlor-benzaldehyde
Tri = triglinaldehyde (3-hydroxy-pentanal)

Preferred embodiments of the invention are described in the Examples which follow. In most cases, amounts are indicated in parts by weight (pbw). Unless otherwise specified, percentages and proportions are given in weight units.

EXAMPLE 1

A coating solution comprised of
3.90 pbw of polymer N,
1.30 pbw of a diazonium salt polycondensation product prepared from 1 mole of 3-methoxy-diphenylamine-4-diazonium sulfate and 1 mole of 4,4'-bis-methoxymethyl-diphenylether, isolated as mesitylene sulfonate,
0.06 pbw of phosphoric acid (85% strength),
0.02 pbw of phenylazodiphenylamine and
0.35 pbw of Victoria Pure Blue FGA (C.I. Basic Blue 81), in
100.00 pbw of 2-methoxyethanol
is applied to a 0.3 mm thick aluminum foil which has been electrochemically grained in nitric acid, anodically oxidized in sulfuric acid and post-treated with a 0.1% strength aqueous solution of polyvinyl phosphonic acid. Application is performed such that a dry layer weight of 1.2 g/m² results.

The photosensitive layer obtained in this way is exposed for 30 seconds through a standard test original by means of a 5 kW metal halide lamp. The exposed layer exhibits a clear contrast between the exposed and unexposed areas and is developed with a developer solution having the following composition:
5.0 pbw of sodium octyl sulfate,
1.0 pbw of sodium metasilicate×5 H₂O, and
94.0 pbw of distilled water.

The non-exposed layer areas are removed within a short time without remainders being left behind. The plate is then rinsed with water and dried. Even the finest image elements of the original are reproduced on the copy. More than 210,000 prints can be run in a sheet-fed offset press with the printing plate produced in this way.

EXAMPLE 2

A coating solution comprised of
1.00 pbw of polymer L,
1.00 pbw of a diazonium salt polycondensation product prepared as in Example 1, but isolated as the methane sulfonate,
1.00 pbw of a diazonium salt polycondensation product obtained from diphenylamine-4-diazonium chloride and paraformaldehyde, prepared in 85% strength phosphoric acid,
0.15 pbw of Basonyl Red 583 (C.I. 45,170), in
23.00 pbw of methanol,
23.00 pbw of propylene glycol monomethylether and
9.00 pbw of distilled water
is applied to an aluminum foil pretreated as described in Example 1, such that a dry layer weight of 0.8 g/m$^2$ is obtained.

The plate is exposed for 40 seconds and then developed by spraying with a water jet, whereby the non-exposed layer areas are removed within a short time, and is then dried.

EXAMPLE 3

A coating solution comprised of
2.60 pbw of polymer O,
1.30 pbw of the diazonium salt polycondensation product described in Example 1,
0.06 pbw of phosphoric acid (85% strength),
0.02 pbw of Metanil Yellow (C.I. 13,065) and
0.30 pbw of Victoria Pure Blue FGA, in
80.00 pbw of 2-methoxyethanol
is applied to an aluminum foil pretreated as described in Example 1, such that the dried layer has a weight of 0.9 g/m$^2$. The layer is exposed as described in Example 1. Development is performed with the aid of a plush pad, using a developer solution having the following composition:
5.0 pbw of sodium octyl sulfate,
1 5 pbw of sodium metasilicate $\times$ 5 H$_2$O,
1.0 pbw of trisodium phosphate $\times$ 12 H$_2$O,
0.5 pbw of disodium hydrogen phosphate $\times$ 12 H$_2$O,
92.0 pbw of distilled water.

The non-exposed areas are removed within 30 seconds. The further treatment is performed as in Example 2. On the copy, step 4 of a silver film continuous-tone step wedge having a density range of 0.05 to 3.05 with increments of 0.15 is reproduced solid. Even the finest lines and screen dots of the original are fully reproduced. When clamped into a sheet-fed offset press, the resulting printing plate gives more than 195,000 prints

EXAMPLE 4

A coating solution is prepared from
1.560 pbw of polymer K,
0.910 pbw of a diazonium salt polycondensation product of Example 1,
0.049 pbw of phosphoric acid (85% strength),
0.162 pbw of 2-(4-methoxystyryl)-4,6-bistrichloromethyl-s-triazine,
1.750 pbw of a technical-grade mixture of pentaerythritol tri- and tetraacrylate, and
0.550 pbw of an azo dye obtained by coupling 2,4-dinitro-6-chlorobenzenediazonium salt with 2-methoxy-5-acetylamino-N-cyanoethyl-N-hydroxyethylaniline, in
70.000 pbw of butanone,
4.000 pbw of ethanol and
2.000 pbw of butylacetate
and applied to the layer support material described in Example 1, such that a dry layer weight of 2.1 g/m$^2$ is obtained.

The layer is exposed through a negative original for 25 seconds, with a solid step 4 resulting. Development is performed with a solution of the following composition:
5.0 pbw of sodium octyl sulfate,
1.5 pbw of sodium metasilicate $\times$ 5 H$_2$O,
1.0 pbw of trisodium phosphate $\times$ 12 H$_2$O,
1.0 pbw of phenoxyethanol and
91.5 pbw of distilled water.

The resulting printing form is clamped into a printing press where it readily accepts ink. The printing test is stopped after 220,000 prints.

EXAMPLE 5

A coating solution is prepared from
6.20 pbw of polymer M,
2.10 pbw of a diazonium salt polycondensation product of Example 1,
0.30 pbw of Victoria Pure Blue FGA (C.I. Basic Blue 81)
0.24 pbw of phosphoric acid (85% strength),
0.24 pbw of 45% strength 2,5-dimethylhexane-2,5-di-tert.-butyl peroxide, as granules with chalk (INTEROX DHBP-45-IC/G made by Peroxid-Chemie GmbH) and
0.07 pbw of phenylazodiphenylamine, in
257.00 pbw of 2-methoxyethanol and
78.00 pbw of tetrahydrofuran,
applied to an aluminum foil pretreated as described in Example 1, and dried. The resulting copying layer, which has a dry weight of 1.1 g/m$^2$, is exposed through a negative original for 30 seconds by means of a 5 kW metal halide lamp. The exposed layer is developed with the developer solution specified in Example 4, with the aid of a plush dabber and subsequently rinsed with water and dried. The non-exposed layer areas are completely removed by development within a few seconds. Step 4 of the silver film continuous-tone step wedge described in Example 3 is solid on the copy.

The printing plate is treated in a drying cabinet at 200° C. for 5 minutes and then allowed to cool down. A printing test in a sheet-fed offset press is stopped after 260,000 prints, although no loss in quality is stated.

EXAMPLE 6

A coating solution is prepared as described in Example 1, except that polymer P is substituted tor polymer N. The solution is applied to plate made of the support material described in Example 1, such that a dry layer weight of 1.2 g/m$^2$ is obtained.

Four of the plates prepared as described above are stored at 100° C. in a drying oven for a period of 1 to 4 hours. After this heat treatment, the plates are imagewise exposed and developed with the developer solution of Example 4. To render visible any layer residues (toning) remaining in the nonimage areas, the dried plates are dyed with a protective ink.

The plates stored in the oven for 1 and 2 hours can be developed satisfactorily. They do not exhibit any substantial extension of the continuous-tone step wedge. After a storage time of 3 hours, the continuous-tone step wedge is extended by two steps. Development is insignificantly retarded. Development of the plate stored for 4 hours is slightly retarded. These results show that the mixtures according to this invention are relatively resistant to storage in the heat.

EXAMPLE 7

A coating solution comprised of
2.2 pbw of polymer Q,
2.2 pbw of 4,4'-diazido-stilbene-2,2'-disulfonic acid sodium salt,
0.3 pbw of Rhodamine 6 GDN extra (C.I. 45,160), and
0.2 pbw of 2-benzoylmethylene-1-methyl-β-naphthothiazoline, in
30.0 pbw of tetrahydrofuran and
120.0 pbw of water
is applied to the support described in Example 1, such that a dry layer weight of 0.9 g/m$^2$ is obtained. The copying layer is exposed for 40 seconds through a negative original and then developed with pure water, whereby the non-image areas are removed within a short time.

EXAMPLE 8

A coating solution is prepared from
0 2.00 pbw of polymer M,
2.00 pbw of the reaction product obtained from 1 mol of 2,4,4-trimethyl-hexamethylene diisocyanate and 2 mol of hydroxyethyl methacrylate,
0.15 pbw of 2,4-bis-trichlormethyl-6-(4-styrylphenyl)-s-triazine and
0.10 pbw of the azo dye specified in Example 4, in
100.00 pbw of propylene glycol monomethyl ether and applied onto the support material specified in Example 1, such that a dry layer weight of 1.3 g/m$^2$ is obtained. The plate is exposed for 25 seconds through a continuous-tone step wedge. Development is performed with the developer solution of Example 1. The plate can be readily developed and exhibits a solid step 4. In a sheet-fed offset press 90,000 good prints are obtained.

EXAMPLE 9

A coating solution is prepared from
2.50 pbw of polymer R,
5.60 pbw of a technical-grade mixture of pentaerythritol tri- and tetraacrylate,
0.20 pbw of the triazine specified in Example 4 and
0.03 pbw of the azo dye specified in Example 4, in
25.00 pbw of butanone,
2.00 pbw of ethanol and
1.00 pbw of butyl acetate
and spin-coated onto a 25 μm thick biaxially stretch-oriented and heat-set polyethylene terephthalate film, such that a layer weight of 35 g/m$^2$ results after drying at 100° C. The dry resist film prepared in this way is laminated at 120° C. onto a phenoplast laminate board clad with a 35 μm thick copper foil, employing a customary laminating device. Exposure is performed for 25 seconds using a customary exposure device. The original used is a line original having line widths and spacings down to 80 μm. Following exposure, the polyester film is carefully peeled off, and the layer is developed for 90 seconds in a spray developing station, with the developer solution specified in Example 1. Thereafter, the plate is rinsed with tap water for 30 seconds, etched for 30 seconds in a 15% strength ammonium peroxydisulfate solution and then electroplated in the following electroplating baths:

1. for 30 minutes in a copper bath from Messrs. Schloetter, Geislingen/Steige, West Germany, type "Glanzkupfer-Bad" (Brilliant Copper Bath). current density: 2.5 A/cm$^2$ metal build-up: about 12.5 μm
2. for 30 minutes in a nickel bath from the same manufacturers, type "Norma". current density: 4.0 A/cm$^2$ metal build-up: 9.0 μm The plate does not exhibit any damage or undercutting. Decoating is performed at a temperature of 50° C., using 5% strength KOH solution. The bared copper is etched away with customary etchants.

EXAMPLE 10

A coating solution comprised of
1.00 pbw of polymer S,
1.00 pbw of a technical-grade mixture of pentaerythritol tri- and tetraacrylate,
0.10 pbw of 2-(4-trichloromethyl-benzoylmethylene-)-3-ethyl-benzothiazoline and
0.02 pbw of Victoria Pure Blue FGA (C.I. Basic Blue) in
50.00 pbw of propylene glycol monomethyl ether
is applied onto an aluminum foil which has been electrochemically grained, anodically oxidized and post-treated with polyvinylphosphonic acid, such that a dry layer of 1.3 g/m$^2$ is obtained. The resulting printing plate is exposed through a test original and developed with the developer solution specified in Example 1.

The printing form immediately accepts ink in a sheet-fed offset press. Even after a prolonged press stand the ink is readily accepted after only 2 to 8 sheets. In the sheet-fed press, 95,000 good prints are obtained, and even the finest lines are completely reproduced.

EXAMPLE 11

A coating solution comprised of
1.00 pbw of polymer T,
1.00 pbw of pentaerythritol triacrylate,
0.10 pbw of the triazine specified in Example 8, and
0.03 pbw of Victoria Pure Blue FGA in
50.00 pbw of propylene glycol monomethyl ether
is applied to the support material described in Example 1, such that a dry layer of 1.1 g/m$^2$ is obtained. The photosensitive layer is exposed for 30 seconds through a negative standard original, using a 5 kW metal halide lamp, and is then developed with the developer specified in Example 1. Step 4 of the step wedge is reproduced solid in the copy. Even the finest screen dots and lines of the original are completely reproduced. In a sheet-fed offset press, 65,000 good prints can be run.

EXAMPLE 12

A printing plate produced as in Example 11 is provided with a 0.5 μm thick protective layer comprised of polyvinyl alcohol (12% residual acetyl groups, K value 4). The plate is exposed for 5 seconds through a standard negative original and developed with the developer solution described in Example 1. It exhibits a solid step 4 and gives 185,000 good prints in a sheet-fed offset press.

This Example illustrates that both the photospeed and the print run can be increased by applying an oxygen barrier layer to the photocurable layer. However, a comparison of Examples 11 and 12 shows that even without a barrier layer a printing plate yielding high print runs is obtained.

EXAMPLE 13

Following exposure, a printing plate produced as described in Example 11 is heat-treated at 100° C. for one minute and then developed. Two additional solid steps are obtained, compared to the plate of Example 11, which was not post-heated.

The number of prints can be triplicated by the thermal post-treatment. A similar increase is achieved as a result of post-exposure.

| Post-treatment | Print run |
| --- | --- |
| none: | 50,000 |
| 1 minute, heating to 100° C.: | 151,000 |
| 1 minute, post-exposure (5 kW): | 156,000 |
| 30 seconds, post-exposure (5 kW): | 150,000 |

What is claimed is:

1. A photosensitive mixture, comprising:
a photocurable compound or combination of compounds in an amount sufficient to produce areas that are insoluble in developer upon exposure to actinic radiation; and
a polymeric binder that is a graft copolymer comprising a polyurethane graft backbone consisting essentially of a polyaddition product obtained from a diisocyanate and a diol, onto which chains are grafted which contain,
   (a) from 20 to 50 mol-% of vinyl alcohol units,
   (b) from 1 to 50 mol-% of carboxylic acid vinyl ester units,
   (c) 7 to 65 mol-% of vinyl acetal units derived from hydroxyaldehydes, and
   (d) from 10 to 70 mol-% of vinyl acetal units derived from aldehydes without free hydroxy groups, the polymeric binder being present in an amount sufficient to produce a uniform film when a layer of the mixture is coated on a substrate.

2. The photosensitive mixture as claimed in claim 1, wherein the photocurable compound is a diazonium salt polycondensation product.

3. The photosensitive mixture as claimed in claim 2, wherein the diazonium salt polycondensation product comprises recurrent units A-N$_2$X and B, which are linked by intermediate members derived from condensible carbonyl compounds, with A being the radical of an aromatic diazonium compound capable of condensation with formaldehyde and B being the radical of a compound free of diazonium groups and capable of condensation with formaldehyde.

4. The photosensitive mixture as claimed in claim 3, wherein B is a radical of an aromatic amine, a phenol, a phenol ether, an aromatic thioether, an aromatic hydrocarbon, an aromatic heterocyclic compound or an organic acid amide.

5. The photosensitive mixture as claimed in claim 4, wherein the intermediate members are methylene groups.

6. The photosensitive mixture as claimed in claim 1, wherein the vinyl acetal units of component (c) are derived from an aliphatic or cycloaliphatic hydroxyaldehyde.

7. The photosensitive mixture as claimed in claim 6, wherein the photocurable compound is a diazonium salt polycondensation product.

8. The photosensitive mixture as claimed in claim 1, wherein the photocurable compound is an organic azido compound.

9. The photosensitive mixture as claimed in claim 8, wherein the organic azido compound includes at least two azido groups in its molecule.

10. The photosensitive mixture as claimed in claim 1, comprising a free-radially polymerizable compound possessing at least one terminal ethylenically-unsaturated group and having a boiling point of more than about 100° C. at normal pressure, and a compound or a combination of compounds which under the action of actinic light is capable of initiating the polymerization of the free-radically polymerizable compound.

11. The photosensitive mixture as claimed in claim 10, wherein the compound which can be polymerized by a free-radical process is an acrylate or methacrylate of a mono- or polyhydric alcohol or an acrylic or methacrylic acid amide.

12. The photosensitive mixture as claimed in claim 10, additionally comprising a diazonium salt polycondensation product.

13. The photosensitive mixture as claimed in claim 1, wherein the photocurable compound is a mixture of photopolymerizable compound and a free-radical photoinitiator.

14. The photosensitive mixture as claimed in claim 1, wherein the diol is selected from the group consisting of an aliphatic diol having 2 to 12 carbon atoms, a cycloaliphatic diol having 5 to 10 carbon atoms and an aliphatic polydiol having a molecular weight between about 200 and 10,000.

15. The photosensitive mixture as claimed in claim 14, wherein the diol is a mixture comprising 1 mol of polydiol and 0.1 to 0.7 mol of low-molecular-weight aliphatic diol.

16. The photosensitive mixture as claimed in claim 1, wherein the diisocyanate is selected from the group consisting of an aliphatic diisocyanate having 4 to 15 carbon atoms and a cycloaliphatic diisocyanate having 7 to 15 carbon atoms.

17. The photosensitive mixture as claimed in claim 1, wherein the graft copolymer has a hydroxyl number in the range of about 100 to 800.

18. The photosensitive mixture as claimed in claim 1, comprising about 20 to 95% by weight of graft copolymer and about 5 to 80% by weight of photocurable compounds or combinations of compounds.

19. The photosensitive mixture as claimed in claim 1, consisting essentially of the photocurable compound or combination of compounds and the polymeric binder.

20. A photosensitive recording material comprising a layer support and a photosensitive layer, wherein the photosensitive layer comprises a mixture as claimed in claim 1.

* * * * *